United States Patent
Cho (10) Patent No.: US 8,580,633 B2
(45) Date of Patent: Nov. 12, 2013

(54) METHOD FOR MANUFACTURING A SEMICONDUCTOR DEVICE WITH GATE SPACER

(75) Inventor: Young Man Cho, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 220 days.

(21) Appl. No.: 13/018,994

(22) Filed: Feb. 1, 2011

(65) Prior Publication Data

US 2012/0175709 A1    Jul. 12, 2012

(30) Foreign Application Priority Data

Jan. 6, 2011 (KR) .................. 10-2011-0001556

(51) Int. Cl.
  *H01L 21/8238*    (2006.01)
(52) U.S. Cl.
  USPC ............... 438/210; 257/E21.64; 257/E21.66; 257/E27.091
(58) Field of Classification Search
  USPC ......... 257/E21.64, E27.091, E21.66; 438/210
  See application file for complete search history.

(56) References Cited

U.S. PATENT DOCUMENTS

| | | | | |
|---|---|---|---|---|
| 5,770,493 A | * | 6/1998 | Fulford, Jr. | 438/199 |
| 2002/0079582 A1 | * | 6/2002 | Satoh | 257/751 |
| 2007/0099385 A1 | * | 5/2007 | Nakajima et al. | 438/283 |
| 2008/0203486 A1 | * | 8/2008 | Wiatr et al. | 257/369 |
| 2008/0237726 A1 | * | 10/2008 | Dyer | 257/369 |

FOREIGN PATENT DOCUMENTS

KR    10-2010-0059251 A    6/2010

* cited by examiner

*Primary Examiner* — Daniel Luke (57) ABSTRACT

A semiconductor device capable of ensuring a sufficient area of a peripheral region by forming a gate spacer to have a uniform thickness in the peripheral region and reducing a fabrication cost by simplifying a mask process and a method of manufacturing the semiconductor device are provided. The semiconductor device includes a gate disposed over a semiconductor substrate; a first spacer disposed over sidewalls of the gate; an insulating layer pattern disposed over sidewalls of the first spacer; and a second spacer disposed over the first spacer and the insulating pattern.

16 Claims, 5 Drawing Sheets

METHOD FOR MANUFACTURING A SEMICONDUCTOR DEVICE WITH GATE SPACER

CROSS-REFERENCES TO RELATED APPLICATION

The present application claims priority to Korean patent application number 10-2011-0001556, filed on Jan. 6, 2011, which is incorporated by reference in its entirety.

BACKGROUND OF THE INVENTION

The present invention relates to a semiconductor device and a method of manufacturing the same, and more particularly, to a semiconductor device including an improved gate spacer and a method of manufacturing the same.

Semiconductor devices, such as dynamic random access memory (DRAM) devices, include a cell region and a peripheral region. The peripheral region includes complementary metal oxide semiconductor (CMOS) transistors. In a typical CMOS transistor, a PMOS transistor has a buried channel structure. As the integration degree of the device increases, the channel length is reduced and therefore, leakage current characteristics are degraded by applying a high electric field. Recently, a dual gate structure has been introduced to embody a PMOS transistor that has a surface channel structure. The dual gate structure represents a structure in which a p-type gate for implanting a p-type impurity is disposed in a region where a PMOS transistor is to be formed, and an N-type gate for implanting an N-type impurity is disposed in a region where an NMOS transistor is to be formed.

Meanwhile, various methods for reducing the area of a cell region of a semiconductor memory device have been suggested. One such method uses a recess gate instead of a planar gate. A recess gate is made by forming a recess in a semiconductor substrate and forming a gate in the recess to form a channel along a curved surface of the recess. Another method using a buried gate, which is formed by completely burying a gate in a recess, has also been introduced.

The buried gate is formed to be completely buried within a semiconductor substrate, thereby having an upper surface level equal to or less than a surface of the semiconductor substrate. Therefore, the buried gate structure can maintain channel length and channel width and can reduce the parasitic capacitance generated between a gate (a word line) and a bit line by 50% as compared with the prior art.

However, in configurations of a cell region and a peripheral region with the buried gate, a space (a height) of the cell region, which is corresponds to a height of a gate formed in the peripheral region, is available. To use the available space, a method of forming a bit line of the cell region when the gate is formed in the peripheral region has been introduced. Herein, the bit line is referred to as a gate bit line (GBL).

SUMMARY

The present invention provides a semiconductor device having a modified gate spacer configuration capable of ensuring a sufficient semiconductor substrate area in a peripheral region by forming a gate spacer that has a uniform thickness in the peripheral region, and reducing a fabrication cost by simplifying a mask process, and a method of manufacturing the semiconductor device.

According to one aspect of an exemplary embodiment, a semiconductor device includes a gate disposed on a semiconductor substrate; a first spacer disposed on a sidewall of the gate; an insulating layer pattern disposed on a sidewall of the first spacer; and a second spacer disposed on the sidewall of the first spacer over the insulating layer pattern. The spacer of a peripheral gate is formed to a uniform thickness to sufficiently ensure the semiconductor substrate area of a peripheral region.

The first spacer may include a nitride layer. The second spacer may include a material having selectivity with an oxide layer and may also include a nitride layer, a silicon oxynitride layer, or an amorphous carbon layer.

The gate may include a CMOS gate including, a gate disposed on a PMOS region of a peripheral region in the semiconductor substrate and a gate disposed on an NMOS region of the peripheral region.

The insulating layer pattern may have a rectangular cross-sectional shape and the second spacer may have a horn cross-sectional shape.

The second spacer may have a height larger than a width thereof. The insulating layer pattern may include one or more selected from the group consisting of boron phosphorous silica glass (BPSG), high density plasma (HDP), spin on dielectric (SOD), and tetraethoxysilane (TEOS).

According to another aspect of another exemplary embodiment, a method of manufacturing a semiconductor device includes forming a gate on a semiconductor substrate; forming a first spacer on a sidewall of the gate; forming an insulating layer pattern on a sidewall of the first spacer; and forming a second spacer formed on the sidewall of the first spacer over the insulating layer pattern. The spacer of a peripheral gate is formed to a uniform thickness to sufficiently ensure the semiconductor substrate area of a peripheral region, and a mask process is simplified to reduce the fabrication cost of the semiconductor device.

The forming of a second spacer may include forming an insulating layer that has a predetermined thickness on the whole surface of the semiconductor substrate, including the gate of which the first spacer is formed on the sidewall; depositing a second spacer material on the insulating layer; and etching back the second spacer material. The second spacer is formed on an upper portion of the sidewall of the gate, and the insulating layer pattern is formed on a lower portion of the is sidewall of the gate.

The method further includes, after the forming a second spacer, opening a PMOS region of the semiconductor substrate and implanting impurity ions into the PMOS region to form a junction region; and opening an NMOS region of the semiconductor substrate and implanting impurity ions into the NMOS region to form a junction region. A process of forming the insulating layer pattern may be performed just prior to the ion implantation process.

The method may further include forming an interlayer insulating layer on the whole surface of the semiconductor substrate, including the PMOS transistor region and the NMOS transistor region; etching the interlayer insulating layer and filling a conduction layer in an etched portion of the interlayer insulating layer to form a contact plug; and forming a metal interconnection on the contact plug so that the peripheral region is configured.

The first spacer may include a nitride layer. The second spacer includes one or more selected from the group consisting of a nitride layer, a silicon oxynitride layer, or an amorphous carbon layer.

The insulating layer pattern may have a rectangular cross-sectional shape, and the second spacer has a horn cross-sectional shape.

According to another aspect of another exemplary embodiment, a method of manufacturing a semiconductor device includes forming a gate on a semiconductor substrate; forming a first spacer on a sidewall of the gate; forming an insulating layer having a predetermined thickness on the whole surface of the semiconductor substrate including the gate; is forming a second spacer on an upper portion of a sidewall of the first spacer over the insulating layer; and etching the insulating layer using the second spacer as a mask to form an insulating layer pattern. The spacer of a peripheral gate is formed to a uniform thickness to sufficiently ensure the semiconductor substrate area of a peripheral region, and a mask process is simplified to reduce a fabrication cost of the semiconductor device.

The forming a second spacer may include depositing a second spacer material on the insulating layer and etching back the second spacer material.

The method may further include opening a PMOS region of the semiconductor substrate and implanting impurity ions into the PMOS region to form a junction region, and opening an NMOS region of the semiconductor substrate and implanting impurity ions into the NMOS region to form a junction region.

The method may further include forming an interlayer insulating layer on the whole surface of the semiconductor substrate, including the PMOS region and the NMOS region; etching an interlayer insulating layer; filling a conduction layer in an etched region of the interlayer insulating layer to form a contact plug; and forming a metal interconnection on the contact plug so that a peripheral region is configured.

The first spacer may include a nitride layer. The second spacer may include one or more selected from the group consisting of a nitride layer, a silicon oxynitride layer, and an amorphous carbon layer. The insulating layer may include an oxide layer.

The insulating layer pattern may have a rectangular cross-sectional shape and the second spacer may have a horn cross-sectional shape. The second spacer may have a height larger than a width thereof.

These and other features, aspects, and embodiments are described below in the section entitled "DESCRIPTION OF EXEMPLARY EMBODIMENT".

BRIEF DESCRIPTION OF THE DRAWINGS

The above and other aspects, features, and other advantages of the subject matter of the present disclosure will be more clearly understood from the following detailed description taken in conjunction with the accompanying drawings, in which.

DESCRIPTION OF EXEMPLARY EMBODIMENT

Embodiments of the present invention are described herein with reference to cross-sectional illustrations that are schematic illustrations of the embodiments (and intermediate structures). As such, variations from shapes in the illustrations as a result, for example, of manufacturing techniques and/or tolerances, are to be expected. Thus, embodiments should not be construed as limited to the particular shapes of regions illustrated herein, but may include deviations in shapes that result, for example, from manufacturing. In the drawings, lengths and sizes of layers and regions may be exaggerated for clarity. Like reference numerals in the drawings denote like elements. It is also understood is that when a layer is referred to as being "on" another layer or substrate, it can be directly on the other or substrate, or intervening layers may also be present.

Hereinafter, a semiconductor device and a method of manufacturing the same according to an embodiment of the present invention will be described in further detail with reference to accompanying drawings.

FIGS. 1 to 5 are cross-sectional views illustrating a method of manufacturing a semiconductor device according to an embodiment of the present invention. First, a configuration of the semiconductor device according to this embodiment will be described with reference to FIG. 5.

Figure 5:
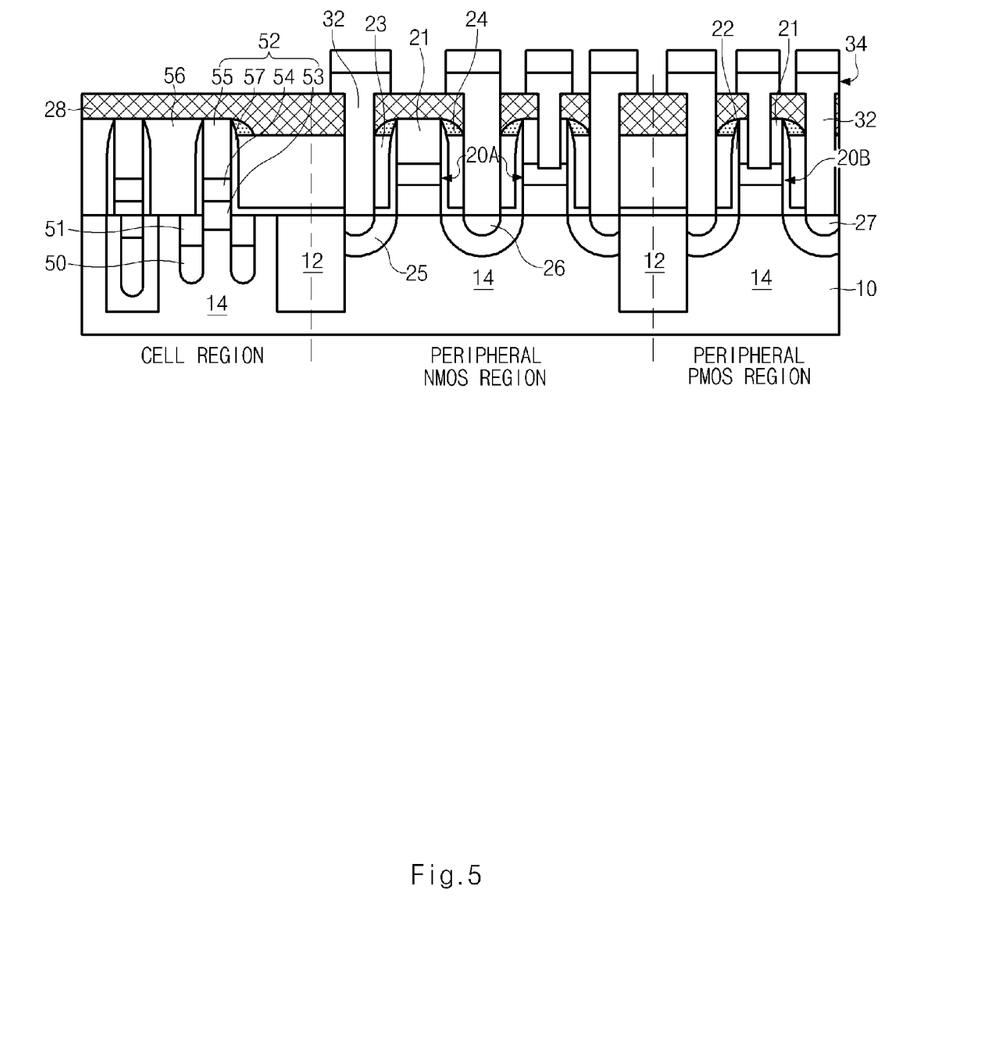

Referring to FIG. 5, an embodiment of the semiconductor device includes a semiconductor substrate 10. The semiconductor substrate 10 includes a cell region and a peripheral region, and the peripheral region includes an NMOS region and a PMOS region. A device isolation film 12, defining an active region 14, is formed in the cell region and the peripheral region. The device isolation film 12 may be formed by a shallow trench isolation (STI) process, which forms a trench that has a predetermined depth in the semiconductor substrate 10 and fills the trench with an insulating layer, such as an oxide layer.

An NMOS gate 20A and a PMOS gate 20B are included in the NMOS region and the PMOS region respectively, in the peripheral region of the semiconductor substrate 10. The NMOS gate 20A and the PMOS gate 20B may be formed of a conduction layer and may be formed of a stacking structure of a polysilicon layer and a metal layer such as is tungsten and titanium. A gate hard mask 21, including a nitride layer, may be formed on each of the NMOS gate 20A and the PMOS gate 20B. A first spacer 22, including a nitride layer, is formed on sidewalls of each of the NMOS gate 20A and the PMOS gate 20B.

An insulating layer pattern 23 and a second spacer 24 are formed on a sidewall of the first spacer 22. At this time, the second spacer 24 is disposed on the insulating layer pattern 23. The insulating layer pattern 23 may include an oxide layer, such as boron phosphorous silica glass (BPSG), high density plasma (HDP), spin on dielectric (SOD), or tetra-ethoxysilane (TEOS). The second spacer 24 may include any of a nitride layer, a silicon oxynitride (SiON) layer and an amorphous carbon layer. The insulating layer pattern 23 may have a substantially rectangular cross-sectional shape, and the second spacer 24 may have a horn cross-sectional shape.

A lightly doped drain (LDD) region 25 and junction regions 26 and 27 are formed in the semiconductor substrate 10 to be adjacent to the NMOS gate 20A and the PMOS gate 20B. Peripheral region contact plugs 32, connected to metal lines 34, are formed over the junction regions 26 and 27.

The above described semiconductor device has a structure such that the first spacers 22, including a nitride layer, are formed on sidewalls of the peripheral gates 20A and 20B; the insulating layer patterns 23, including an oxide layer, are formed on lower portions of sidewalls of the first spacers 22; and the second spacers 24, including a nitride layer, are formed on upper portions of the sidewalls of the first is spacers 22.

In general, a nitride layer has a uniform deposition thickness compared with an oxide layer. Therefore, the gate spacer 22, 23, and 24, which include nitride layers, are formed to have a uniform thickness, thereby ensuring a sufficient margin in forming the peripheral region contact plug 32. In addition, it is possible to maintain a uniform distance between the peripheral gates 20A and 20B, and to maintain a uniform distance between the junction regions 26 and 27 and a channel (not shown) corresponding to a region between the peripheral gates 20A and 20B and the semiconductor substrate 10 in a peripheral transistor.

Hereinafter, a configuration of the cell region of a semiconductor device according to an embodiment will be described with reference to FIG. 5. In this embodiment, the configuration of the cell region is not specially limited, but it is possible to reduce effects of a mask process if the configuration of the cell region has a buried gate structure and a gate bit line (GBL) structure which will be described later.

Referring to FIG. 5, recesses having a predetermined depth are formed in the active region 14 and the isolation region 12 of the cell region, and buried gates 50, which are buried within lower portions of the recesses, are formed. Buried gates 50 include a conductive material, such as tungsten, titanium, or a polysilicon. A capping layer 51 is formed on the buried gates 50 to protect and isolate an upper portion of the buried gates 50. The capping layer 51 may include a nitride layer. A bit line 52, having the same height as the peripheral gates 20A and 20B, is formed on the semiconductor substrate 10.

The bit line 52 may include a bit line contact 53, a bit line conduction layer 54, a bit line hard mask 55, and a bit line spacer 57. The bit line contact 53 is connected to the semiconductor substrate 10 and may include polysilicon. The bit line conduction layer 54 includes a conductive material and may also include the same material as the peripheral gates 20A and 20B. The bit line hard mask 55, formed over the bit line conduction layer 54, and the bit line spacer 57, formed at a sidewall of the bit line 52, may include a nitride layer. A storage node contact plug 56 may be formed on a portion of the semiconductor substrate 10 in which the bit line 52 is not formed, thereby connecting a capacitor (not shown) over the bit line 52 to the semiconductor substrate 10.

A semiconductor device that includes the above configurations of the cell region and the peripheral region according to an embodiment can be fabricated without performing a mask process of opening the cell region. It is thus possible to simplify the fabrication process of the semiconductor device and to reduce fabrication cost.

Hereinafter, a method of manufacturing the semiconductor device having the above configurations will be described with reference to FIGS. 1 to 5.

Figure 1:
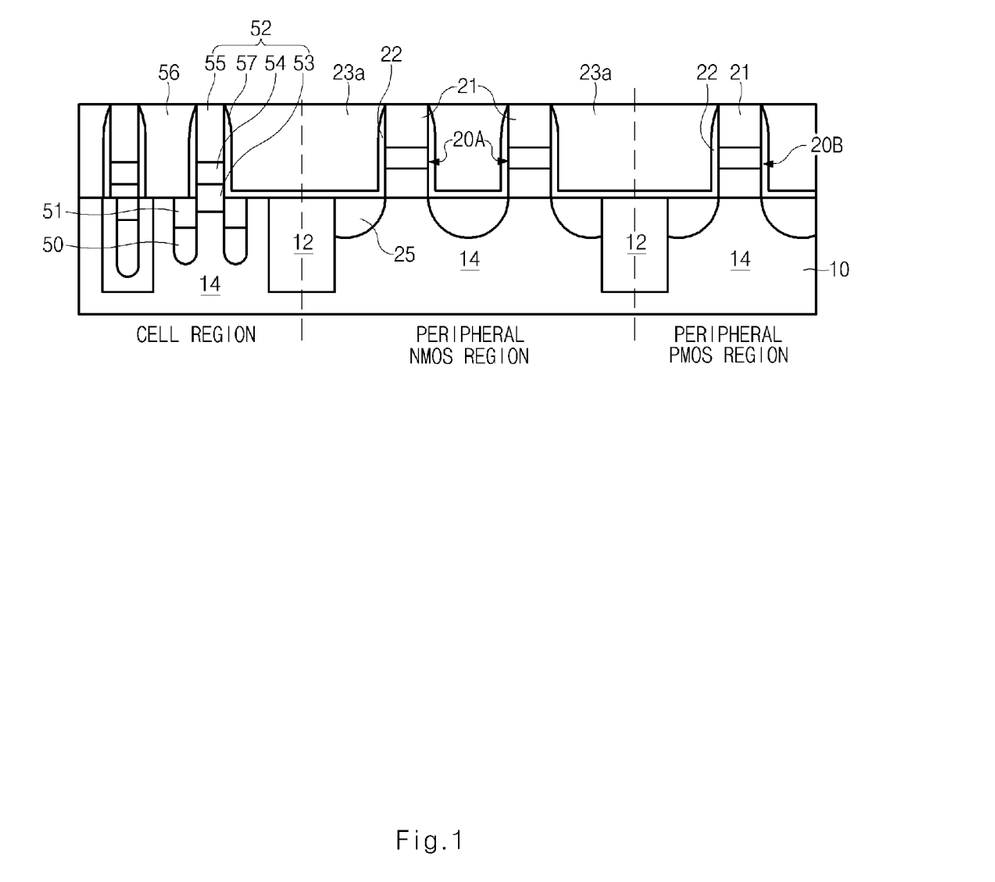
FIGS. 1 to 5 are cross-sectional views illustrating a method of manufacturing a semiconductor device according to an embodiment of the present invention.

Referring to FIG. 1, the device isolation film 12, defining the active region 14, is formed in the semiconductor substrate 10, which includes the cell region and the peripheral region. The device isolation film 12 may be formed by a shallow trench isolation (STI) process, which forms a trench having a predetermined depth in the semiconductor is substrate 10 and fills the trench with an insulating layer, such as an oxide layer.

A portion of the semiconductor substrate 10 that corresponds to the cell region is etched to form a recess, and a conduction layer is buried within a lower portion of the recess to form the buried gate 50. The capping layer 51 is formed over the buried gate 50 and will be buried in an upper portion of the recess. The peripheral gates 20A and 20B in the peripheral region and the bit line 52 in the cell region may be formed simultaneously. For example, a polysilicon layer and a metal layer may be formed sequentially in the cell region and the peripheral region of the semiconductor substrate 10, and then a nitride layer may be formed on the metal layer. The nitride layer, the metal layer, and the polysilicon layer are then etched using a mask to form the bit line 52, including the bit line contact 53, the bit line conduction layer54, the bit line hard mask 55 in the cell region, and the peripheral gates 20A and 20B, including the conduction layers and the gate hard mask 21 in the peripheral region. At this time, the bit line contact 53 may be simultaneously formed.

Subsequently, the lightly doped drain (LDD) regions 25 (not shown in the cell region) are formed in the active region 14 to be adjacent to the peripheral gates 20A and 20B. A first interlayer insulating layer 23a is deposited to fill spaces between the peripheral gates 20A and 20B in the peripheral region and the bit line 52 in the cell region. The first interlayer insulating layer 23a in the cell region is etched using a predetermined mask to form a storage node contact hole, and a conduction material is buried in the storage node contact hole to is form the storage node contact plug 56.

Figure 2:
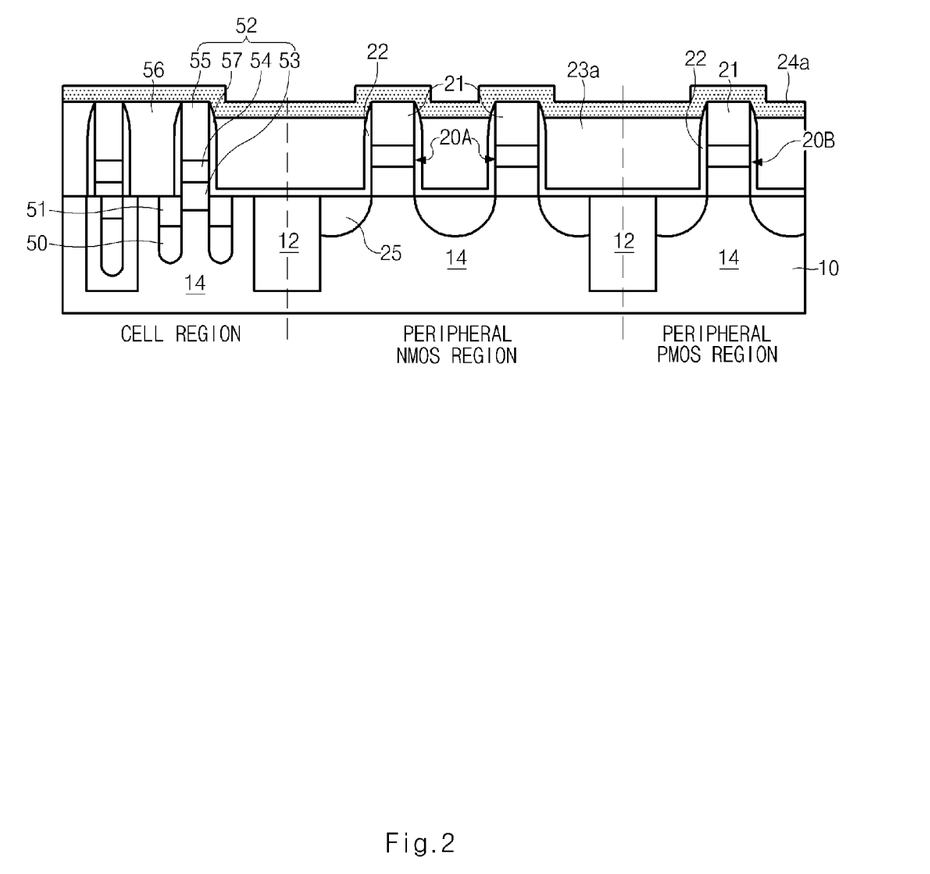

Referring to FIG. 2, the first interlayer insulating layer 23a is etched by a predetermined thickness to form a structure such that the bit line hard mask 55 in the cell region and the gate hard mask 21 in the peripheral region protrude. At this time, the etched predetermined thickness of the first interlayer insulating layer 23a may be larger than widths of the insulating layer pattern 23 (refer to FIG. 4) and the second spacer 24 (refer to FIG. 3), which will be formed in a subsequent processes. If the first interlayer insulating layer 23a is not etched to a sufficient depth, then the second spacer 24 (refer to FIG. 3) is not formed to have a sufficient width and the insulating layer pattern 23 (refer to FIG. 4) is thinly formed, thereby degrading characteristics of transistors.

After that, a second spacer material 24a is deposited to have a predetermined thickness on the surface of the result structure, which includes the etched first interlayer insulating layer 23a. The second spacer material 24a may include a material that has better thickness uniformity in depositing than an oxide layer, e.g., a nitride layer, a silicon oxynitride layer, an amorphous carbon layer, or the like.

Figure 3:
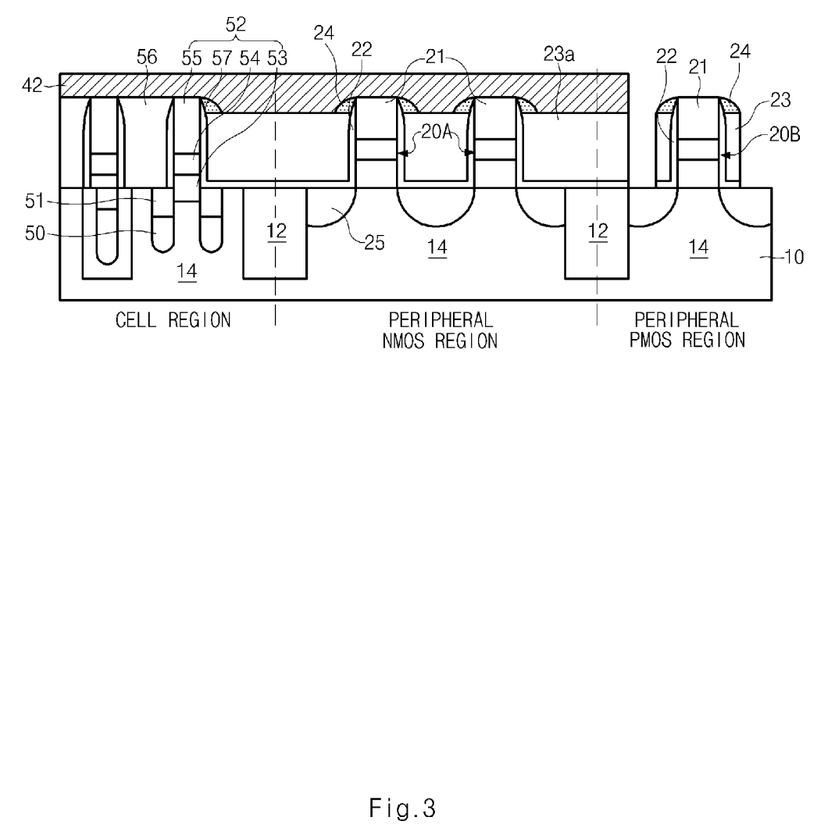

Referring to FIG. 3, the second spacer material 24a is anisotropically etched (or etched back) to form the second spacer 24 on an upper portion of a sidewall of the first spacer 22 of each of the peripheral gates 20A and 20B. The second spacer 24 may be formed to have a horn shape by an anisotropic etching process.

Then a PMOS mask 42, which opens the PMOS region and is includes a material such as a photoresist film, is formed. A portion of the first interlayer insulating layer 23a in the PMOS region is etched using the PMOS mask 42 and the second spacer 24 as an etch mask to form the insulating layer pattern 23. The insulating layer pattern 23 may include an oxide layer, and a cross-sectional shape of the insulating layer pattern 23 may be a rectangular shape, as illustrated in FIG. 3. The insulating layer pattern 23 is disposed at the sidewalls of the first spacer 22 below the second spacer 24. Subsequently, the junction region 27 is formed in the LDD region 25 in the PMOS region by performing a high concentration ion implantation process. When the junction region 27 is formed in the LDD region 25, a sufficient channel length can be ensured to prevent a shortening of the channel length due to a short channel effect, such as a leakage current.

Figure 4:
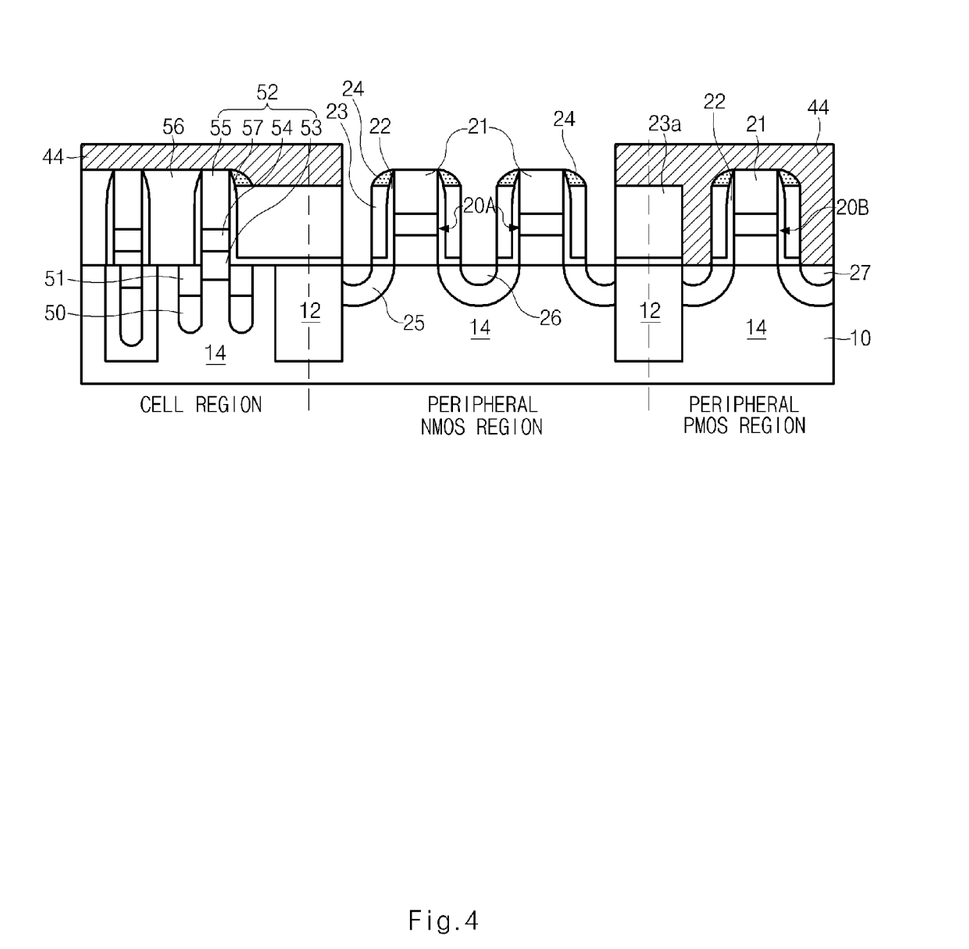

Referring to FIG. 4, the PMOS mask 42 is removed using a strip process or a cleaning process, and an NMOS mask 44, which opens the NMOS region and includes a material such as a photoresist film, is formed. A portion of the first interlayer insulating layer 23a in the NMOS region is etched, using the NMOS mask 44 and the second spacer 24 as an etch mask, to form the insulation layer pattern 23. The material and position of the insulating layer pattern 23 in the NMOS region is the same as that of the insulating layer pattern 23 in the PMOS region, and therefore a description for the insulating layer pattern 23 formed in the NMOS region which has substantially the same characteristics as those of the insulating layer pattern 23 in the PMOS region will be omitted. Similarly, the junction region 26 is formed in the LDD region 25 in the NMOS region using a high concentration ion implantation process.

Referring back to FIG. 5, the NMOS mask 44 is removed using a strip process or a cleaning process. A second interlayer insulating layer 28 is formed on the surface of the resulting structure, including the cell region and the peripheral region, as shown in FIG. 4. The second interlayer insulating layer 28 is then planarized. A mask (not shown) defining a contact is formed on the second interlayer insulating layer 28, and the second interlayer insulating layer 28 and the first interlayer insulating layer 23a are etched using the mask. A conduction material is used to fill etched portions of the first interlayer insulating layer 23a and the second interlayer insulating layer 28 to form the peripheral region contact plug 32. The metal line 34 connected to the peripheral region contact plug 32 is formed over the second interlayer insulating layer 28.

According to the method of manufacturing the semiconductor device, the second spacer 24 is formed on the upper portion of the sidewall of each of the peripheral gates 20A and 20B. This makes it possible to omit a process of the conventional art of depositing a thick oxide layer on the sidewalls of each of the peripheral gates 20A and 20B. When the thick oxide layer is formed as it is in the conventional art, since an oxide spacer is also formed on the sidewall of the bit line in the cell region, it is necessary to form a mask for opening the cell region and to etch the oxide spacer to remove the oxide spacer after the process of FIG. 4. However, in accordance with an embodiment of the present invention, the oxide spacer, i.e., the insulating layer pattern 23 is formed by etching the first interlayer insulating layer 23a using the second spacer 24 as a mask just prior to performing the ion implantation processes, as illustrated in FIGS. 3 and 4, so that a process for opening the cell region is omitted to simplify the fabrication process.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A method of manufacturing a semiconductor device, the method comprising:
   simultaneously forming a gate over a semiconductor substrate in a peripheral region and a plurality of bit lines over the semiconductor substrate in a cell region;
   forming first spacers over a sidewall of the gate and over a sidewall of the bit lines, respectively;
   forming a storage node contact plug between the bit lines in the cell region;
   forming an insulating layer pattern over a lower portion of a sidewall of the first spacer of the gate in the peripheral region; and
   forming a second spacer over an upper portion of the sidewall of the first spacer of the gate in the peripheral region and over the insulating layer pattern in the peripheral region.

2. The method of claim 1, wherein the forming of the second spacer includes:
   forming an insulating layer having a predetermined thickness over the whole surface of a resultant structure including the gate formed over the semiconductor substrate and the first spacer formed over the sidewall of the gate;
   depositing a second spacer material over the insulating layer; and
   etching back the second spacer material.

3. The method of claim 1, further comprising:
   opening a PMOS region of the semiconductor substrate and implanting impurity ions into the PMOS region to form a junction region; and
   opening an NMOS region of the semiconductor substrate and implanting impurity ions into the NMOS region to form a junction region.

4. The method of claim 3, further comprising:
   forming an interlayer insulating layer over the whole surface of a resultant structure including the PMOS region and the NMOS region where the junction regions are formed;
   selectively etching the interlayer insulating layer and filling a conduction layer in an etched portion where the interlayer insulating layer is removed, thereby forming a contact plug; and
   forming a metal interconnection layer over the contact plug.

5. The method of claim 1, wherein the first spacers include a nitride layer, and the second spacer includes one selected from the group consisting of a nitride layer, a silicon oxynitride layer, an amorphous carbon layer, and a combination thereof.

6. The method of claim 1, wherein the insulating layer pattern has a rectangular cross-sectional shape, and the second spacer has a horn cross-sectional shape.

7. A method of manufacturing a semiconductor device, the method comprising:
   simultaneously forming a plurality of gates over a semiconductor substrate in a peripheral region and a plurality of bit lines over a semiconductor substrate in a cell region;
   forming first spacers over sidewalls of the gates and over sidewalls of the bit lines, respectively;
   forming an insulating layer to entirely fill a space between the gates;
   forming a storage node contact plug between the bit lines;
   etching the insulating layer to expose an upper surface of the plurality of gates and an upper portion of sidewalls of the first spacers in the peripheral region;
   forming a second spacer over the exposed upper portion of the sidewalls of the first spacers in the peripheral region and the etched insulating layer; and
   etching the insulating layer using the second spacer as a mask to form an insulating layer pattern.

8. The method of claim 7, wherein the forming of the second spacer includes:
   depositing a second spacer material over the etched insulating layer; and
   etching back the second spacer material so that the second spacer material remains on the upper portion of the sidewalls of the first spacers in the peripheral region.

9. The method of claim 7, further comprising:
   opening a PMOS region of the semiconductor substrate and implanting impurity ions into the PMOS region to form a junction region; and
   opening an NMOS region of the semiconductor substrate and implanting impurity ions into the NMOS region to form a junction region.

10. The method of claim 9, further comprising:
forming an interlayer insulating layer over the whole surface of the semiconductor substrate including the PMOS region and the NMOS region where the junction regions are formed;
selectively etching the interlayer insulating layer and filling a conduction layer in an etched region where the interlayer insulating layer is removed, thereby forming a contact plug; and
forming a metal interconnection over the contact plug.

11. The method of claim 7, wherein the first spacer includes a nitride layer, and the second spacer includes one or more selected from the group consisting of a nitride layer, a silicon oxynitride layer, an amorphous carbon layer, and a combination thereof.

12. The method of claim 7, wherein the insulating layer includes an oxide layer.

13. The method of claim 7, wherein the insulating layer pattern has a rectangular cross-sectional shape, and the second spacer has a horn cross-sectional shape.

14. The method of claim 7, wherein the second spacer has a height larger than a width thereof.

15. The method of claim 2, further comprising:
etching the insulating layer to expose an upper surface of the gate and the upper portion of the sidewall of the first spacer in the peripheral region before depositing the second spacer material.

16. The method of claim 1, wherein forming the storage node contact plug comprises:
forming an insulating layer having a predetermined thickness over a whole surface of a resultant structure including the first spacer, the gate in the peripheral region, and the bit lines in the cell region;
etching the insulating layer provided between the bit lines in the cell region to form a storage node contact hole; and
filling the storage node contact hole with a conduction material,
wherein the storage node contact plug is formed before the insulating layer pattern is formed.

* * * * *